(12) United States Patent  (10) Patent No.: US 8,539,412 B2
Arayama et al.  (45) Date of Patent:  Sep. 17, 2013

(54) MACRO LAYOUT VERIFICATION APPARTUS

(75) Inventors: Masashi Arayama, Kawasaki (JP); Sumiko Makino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/618,553

(22) Filed: Sep. 14, 2012

(65) Prior Publication Data

US 2013/0014067 A1  Jan. 10, 2013

Related U.S. Application Data

(60) Division of application No. 12/785,624, filed on May 24, 2010, now Pat. No. 8,286,117, which is a continuation of application No. PCT/JP2007/075178, filed on Dec. 27, 2007.

(51) Int. Cl.
*G06F 17/50* (2006.01)
(52) U.S. Cl.
USPC ........... 716/111; 716/115; 716/126; 716/130; 716/131
(58) Field of Classification Search
USPC .......................... 716/111, 115, 126, 130–131
See application file for complete search history.

(56) References Cited

U.S. PATENT DOCUMENTS

| | | | |
|---|---|---|---|
| 4,295,149 A | 10/1981 | Balyoz et al. | |
| 4,636,965 A | 1/1987 | Smith et al. | |
| 5,483,481 A | 1/1996 | Hizume et al. | |
| 5,568,395 A * | 10/1996 | Huang | 716/102 |
| 5,620,916 A * | 4/1997 | Eden et al. | 716/112 |
| 5,634,093 A * | 5/1997 | Ashida et al. | 345/443 |
| 5,883,812 A | 3/1999 | Fujii | |
| 6,401,233 B1 | 6/2002 | Suzuki et al. | |
| 6,753,611 B1 * | 6/2004 | Maeno et al. | 257/774 |
| 6,810,340 B2 | 10/2004 | Shimazaki et al. | |
| 6,892,368 B2 * | 5/2005 | Li et al. | 716/112 |
| 6,907,589 B2 * | 6/2005 | Frank et al. | 716/112 |
| 6,915,249 B1 | 7/2005 | Sato et al. | |
| 6,968,521 B2 | 11/2005 | Ushiyama et al. | |
| 6,983,436 B2 | 1/2006 | Amekawa | |
| 7,046,522 B2 * | 5/2006 | Sung et al. | 361/803 |

(Continued)

FOREIGN PATENT DOCUMENTS

| | | |
|---|---|---|
| JP | 5-102307 | 4/1993 |
| JP | 10-308451 | 11/1998 |

(Continued)

OTHER PUBLICATIONS

English language of International Search Report for PCT/JP2007/075178, mailed on Apr. 8, 2008.

(Continued)

*Primary Examiner* — Naum Levin
(74) *Attorney, Agent, or Firm* — Staas & Halsey LLP

(57) ABSTRACT

A macro layout verification apparatus for verifying a layout of a macro to be placed as a functional block on a semiconductor device. The apparatus includes: a unit, which assumes as a virtual wiring line, a wiring line that uses an unused intra-macro channel located adjacent to an intra-macro wiring line; a unit which calculates a parallel wiring length along which the virtual wiring line and the intra-macro wiring line run; and a unit which outputs information concerning the virtual wiring line when the parallel wiring length exceeds a reference value defined as a design rule.

2 Claims, 9 Drawing Sheets

(56) References Cited

U.S. PATENT DOCUMENTS

| | | | |
|---|---|---|---|
| 7,086,018 | B2 | 8/2006 | Ito |
| 7,149,989 | B2 * | 12/2006 | Lakshmanan et al. ........ 716/112 |
| 7,257,792 | B2 * | 8/2007 | Nakayama et al. ........... 716/122 |
| 7,600,205 | B2 | 10/2009 | Ikeda |
| 7,698,676 | B1 * | 4/2010 | Qian .............................. 716/119 |
| 8,286,117 | B2 * | 10/2012 | Arayama et al. .............. 716/130 |
| 2002/0178429 | A1 * | 11/2002 | Nakayama et al. ............. 716/15 |
| 2005/0081176 | A1 | 4/2005 | Ohshige |
| 2006/0117289 | A1 | 6/2006 | Katagiri |

FOREIGN PATENT DOCUMENTS

| | | |
|---|---|---|
| JP | 2000-269341 | 9/2000 |
| JP | 2002-24310 | 1/2002 |
| JP | 2005-115785 | 4/2005 |

OTHER PUBLICATIONS

Office Action mailed Nov. 28, 2011 for U.S. Appl. No. 12/785,624.
Office Action mailed Feb. 2, 2012 for U.S. Appl. No. 12/785,624.
Notice of Allowance mailed Jun. 8, 2012 for U.S. Appl. No. 12/785,624.
Machine translation into Engllish of Japanese Patent Publication 9-62731, published in Mar. 1997.
U.S. Appl. No. 12/785,624, filed May 24, 2010, Masashi Arayama et al, Fujitsu Limited.

* cited by examiner

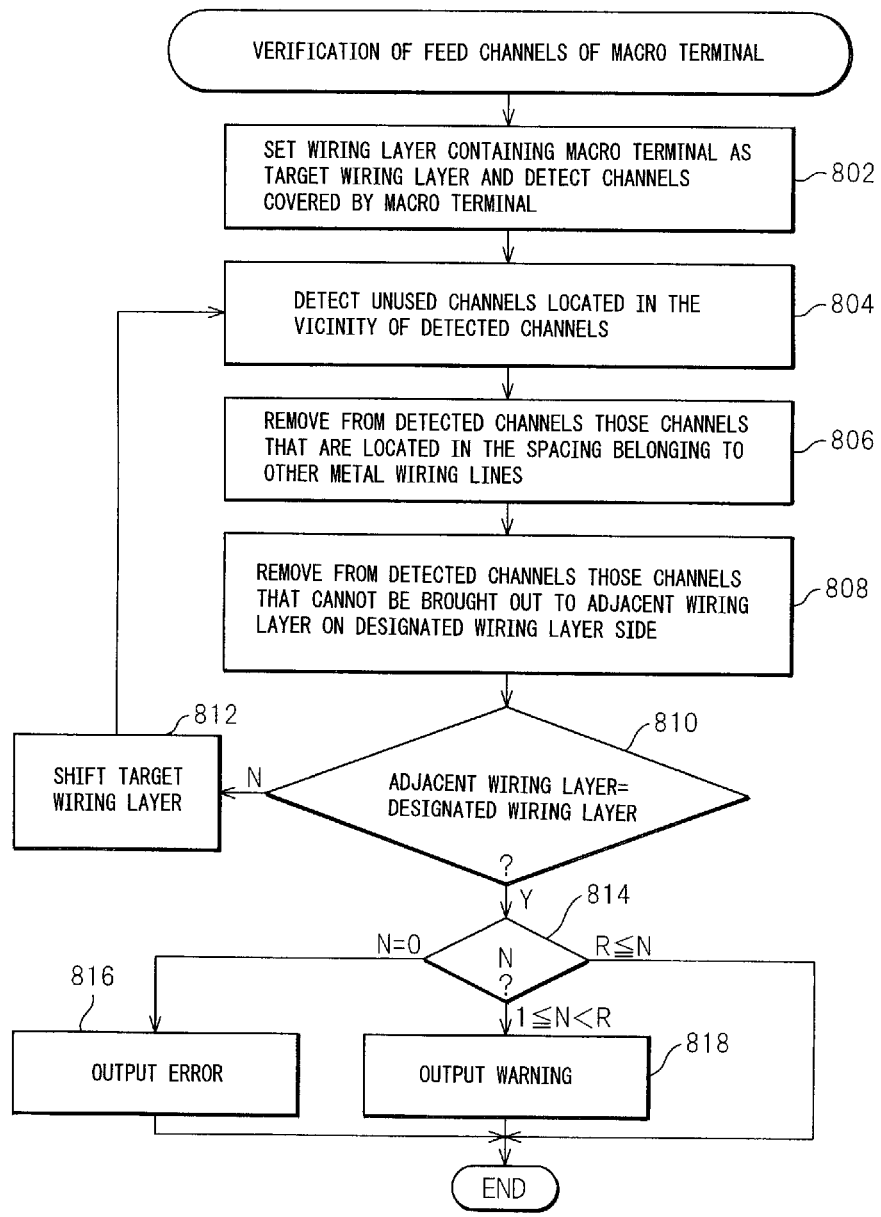

UPPER LAYER SUPERIMPOSED ON LOWER LAYER

○ CHANNEL THAT CAN BE BROUGHT OUT
× CHANNEL THAT CANNOT BE BROUGHT OUT

LOWER LAYER

UPPER LAYER

UPPER LAYER CONNECTING VIA CONTACT

MACRO LAYOUT VERIFICATION APPARTUS

CROSS-REFERENCE TO RELATED APPLICATIONS

This application is a divisional of U.S. application Ser. No. 12/785,624, filed May 24, 2010, issued as U.S. Pat. No. 8,286,117, which is a continuation of PCT/JP2007/075178, filed on Dec. 27, 2007, the entire contents of both applications are incorporated herein by reference.

FIELD

Embodiments discussed herein are related to an apparatus for verifying the layout of a macro designed as a functional block in the development process of a semiconductor device, such as an LSI.

BACKGROUND

As depicted in FIG. 1, when designing an LSI (Large Scale Integrated) circuit, first the layout of a macro itself as a functional block is designed in accordance with design rules (step 102). Next, the macro is placed on the LSI and inter-macro wiring is made (step 104). Finally, the entire LSI and the layout of the macro on the LSI are verified (step 106).

Since the layout within the macro is referred to when verifying the LSI layout, the amount of data to be handled increases, resulting in an increase in processing time. Further, macro terminals have to be connected on the LSI in order to place the macro on the LSI and make inter-macro wiring, but if there are not enough channels to connect the terminals, the macro cannot be placed and wired on the LSI.

Furthermore, even when the layout of the macro itself satisfies the design rules, there can occur cases where the relationship between the LSI wiring and the intra-macro wiring fails to satisfy the design rules when the macro is placed and wired on the LSI. For example, a rule violation associated with the parallel wiring of the LSI wiring and intra-macro wiring may be detected. In this way, problems that can occur due to interference between the layout within the macro and the LSI wiring when the macro is placed and wired on the LSI cannot be detected unless the macro is actually placed and wired on the LSI.

In designing the layout of the LSI, if an error occurs in the layout verification in relation to the intra-macro wiring, the intra-macro wiring cannot be modified without greatly affecting the design process. To address this, a method is employed that prohibits the use of wiring channels located adjacent to the intra-macro wiring during the LSI wiring so that the macro can be placed and wired on the LSI without having to be conscious of the layout within the macro. However, in designing the layout of the LSI, if the use of wiring channels located adjacent to the intra-macro wiring is prohibited, a problem occurs in that the number of channels available for use decreases, resulting in a degradation of wiring characteristics.

Patent document 1 cited below as a prior art document related to the present invention discloses an LSI design rule verification method wherein the verification of design rules is made by considering the hierarchy used in automatic layout. On the other hand, patent document 2 cited below discloses a functional macro design method that achieves connectivity having a high degree of wiring freedom without violating the design rules when connecting with other cells.

Patent document 1: Japanese Unexamined Patent Publication No. H05-102307
Patent document 2: Japanese Unexamined Patent Publication No. 2000-269341

SUMMARY

According to an aspect of the invention, a macro layout verification apparatus for verifying a layout of a macro to be placed as a functional block on a semiconductor device includes: a unit configured to assume as a virtual wiring line a wiring line that uses an unused intra-macro channel located adjacent to an intra-macro wiring line; a unit configured to calculate a parallel wiring length along which the virtual wiring line and the intra-macro wiring line run; and a unit configured to output information concerning the virtual wiring line when the parallel wiring length exceeds a reference value defined as a design rule.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 8 is a flowchart illustrating a procedure for verifying feed channels of the macro terminal;

DESCRIPTION OF EMBODIMENTS

Embodiments of the present invention will be explained with reference to the accompanying drawings.

Figure 1:
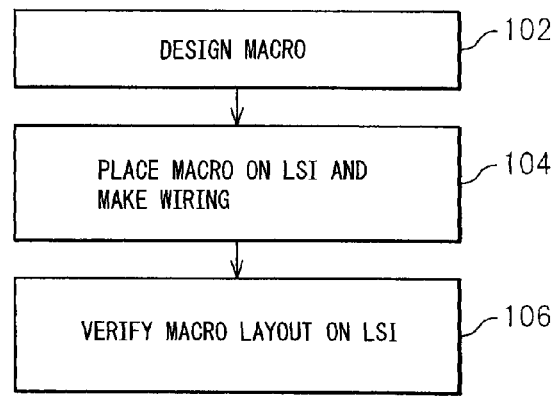
FIG. 1 is a flowchart depicting the sequence of prior art macro layout verification.
Figure 2:
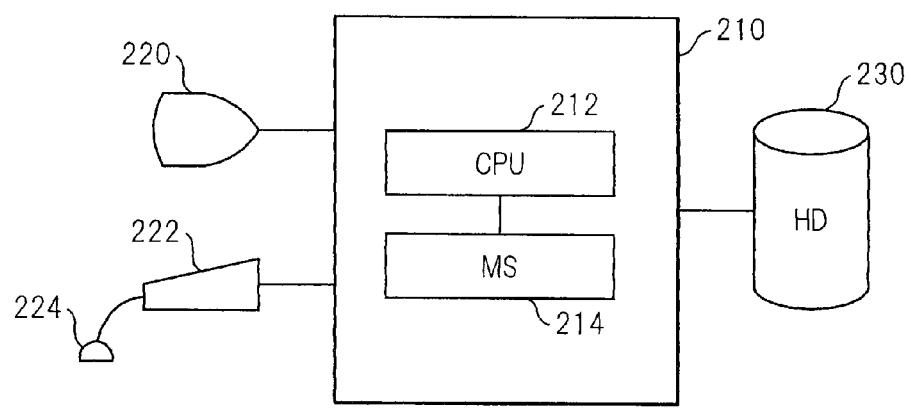
FIG. 2 is a block diagram depicting the hardware configuration of a macro layout verification apparatus according to one embodiment.

FIG. 2 is a block diagram depicting the hardware configuration of a macro layout verification apparatus according to one embodiment. As illustrated, the macro layout verification apparatus according to the present embodiment is implemented by running a macro layout verification program on a conventional workstation (WS) which comprises a computer main unit 210 having a central processing unit (CPU) 212 and a main storage (MS) 214, a display 220 as an output device, a keyboard 222 as an input device, a mouse 224 as an input device, and a hard disk device 230 as an auxiliary (external) storage device.

Figure 3:
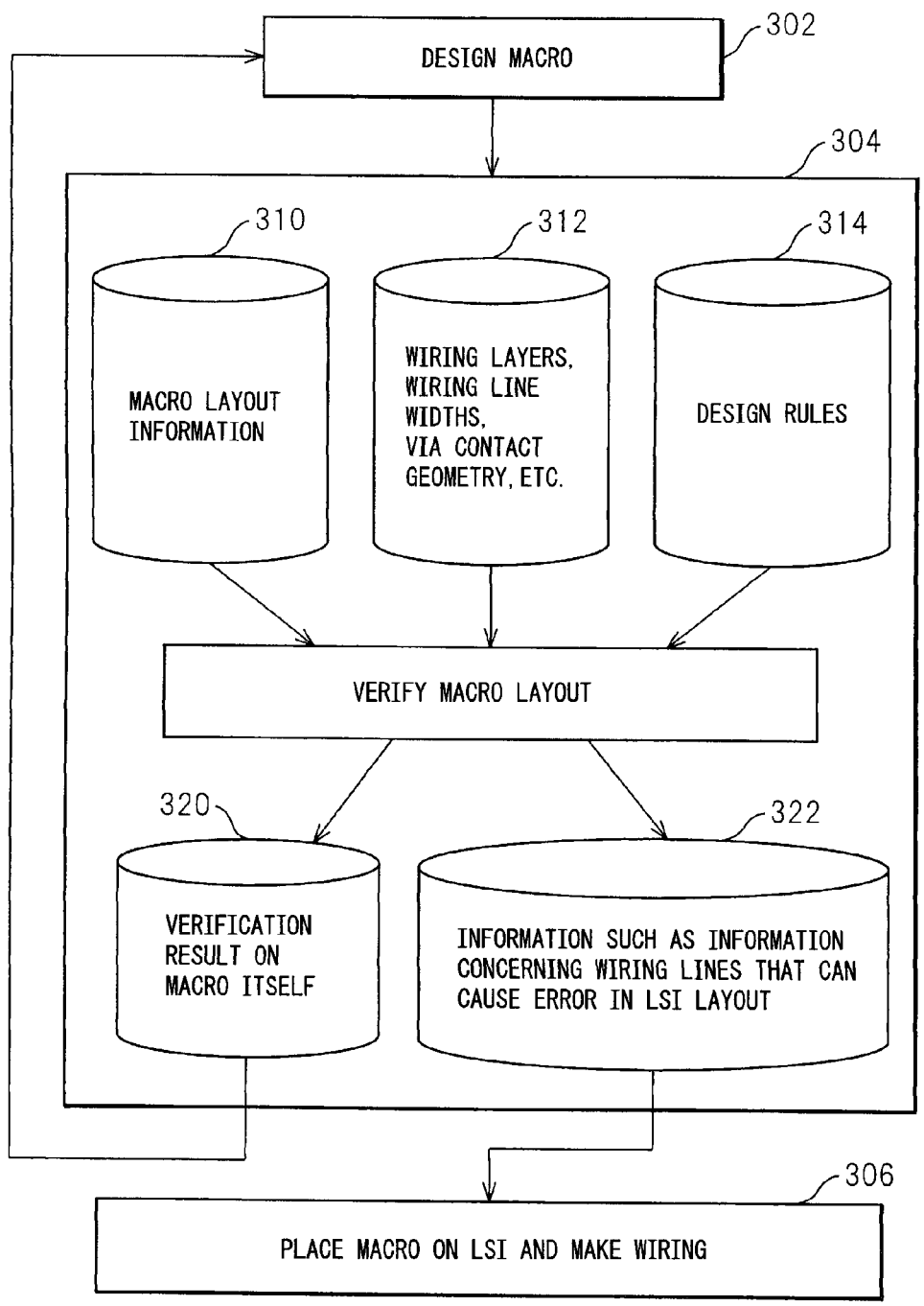
FIG. 3 is a schematic flow diagram of macro layout verification according to one embodiment.

FIG. 3 is a schematic flow diagram of macro layout verification according to one embodiment. As depicted in the diagram, first the layout of a macro as a functional block is designed (step 302). Next, the macro layout verification according to the present embodiment is performed (step 304). Then, the macro is placed on the LSI and inter-macro wiring is made (step 306).

As depicted in FIG. 3, in the macro layout verification (step 304), macro layout information 310, information 312 defining LSI wiring layers, wiring line widths, via contact geometry, etc., and design rules 314 are taken as inputs, and a verification result 320 on the macro itself and information 322, such as information concerning wiring lines that can cause an error in the LSI design layout, are output. The verification result 320 on the macro itself is fed back to the design of the macro. On the other hand, the information 322, such as the information concerning wiring lines that can cause an error in the LSI design layout, is used when placing and wiring the macro on the LSI. This serves to avoid an error that can occur after the placement and wiring, achieving a reduction in the number of layout steps. Furthermore, the wiring characteristics can be enhanced by making effective use of the wiring channels within the macro.

Figure 4:
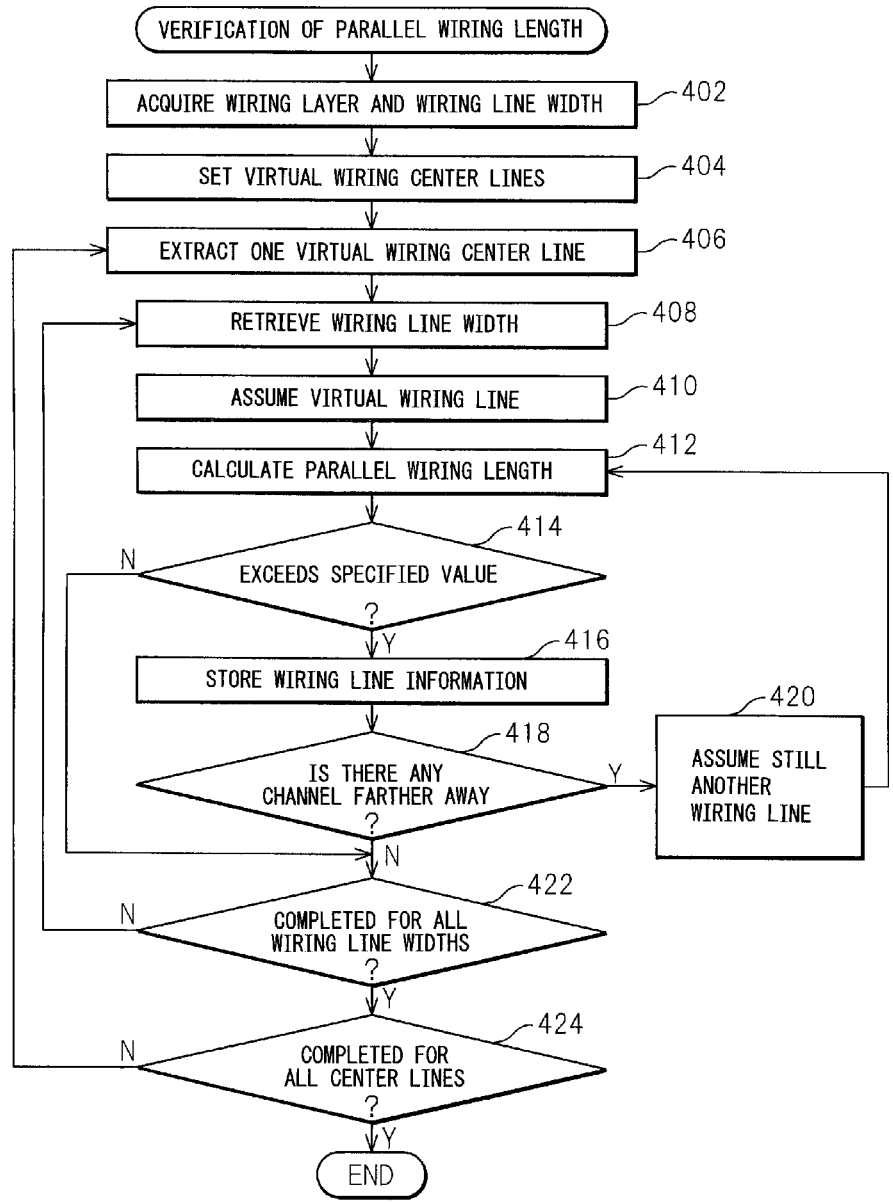
FIG. 4 is a flowchart illustrating a procedure for verifying parallel wiring length.

In the present embodiment, the first item of the macro layout verification concerns verifying the parallel wiring length at the time of LSI circuit wiring. When two wiring lines run in parallel in close proximity to each other, crosstalk noise can occur; therefore, in the layout rules, the maximum allowable length (parallel wiring length) along which two wiring lines run is defined according to the wiring line width, the spacing between the two wiring lines, etc. In the present embodiment, the verification of the parallel wiring length is performed to verify whether or not the layout within the macro satisfies the LSI layout rules when unused channels within the macro are used for the wiring of the LSI circuit. FIG. 4 is a flowchart illustrating a procedure for verifying the parallel wiring length, and FIG. 5 is a diagram depicting an example of how the parallel wiring length is verified.

First, information defining the wiring layers of the LSI circuit and the wiring line width used in each wiring layer is acquired from the layout conditions of the LSI circuit (step 402). When a plurality of wiring layers are defined for the LSI circuit, information defining the plurality of wiring layers is acquired in advance. Further, when a plurality of wiring line widths are defined for the respective wiring layers, information defining the plurality of wiring line widths is acquired in advance.

Next, for each intra-macro wiring line, unused wiring channels in the LSI circuit that are located adjacent to that intra-macro wiring line are detected as virtual wiring channels, and a virtual wiring center line is set that interconnects the detected virtual wiring channels (step 404). The unused wiring channels to be detected here are those that are formed in the same wiring layer as the wiring layer containing the intra-macro wiring line, that satisfy the spacing requirements of the intra-macro wiring, and that are closest to the intra-macro wiring line. For LSI fabrication reasons, a prescribed spacing must be provided between a metal forming a given intra-macro wiring line and a metal forming another intra-macro wiring line; therefore, spacing rules are defined that prohibit the use of channels located within the prescribed spacing distance from the boundary of the intra-macro wiring line, the spacing distance being determined according to the wiring line width.

Figure 5:
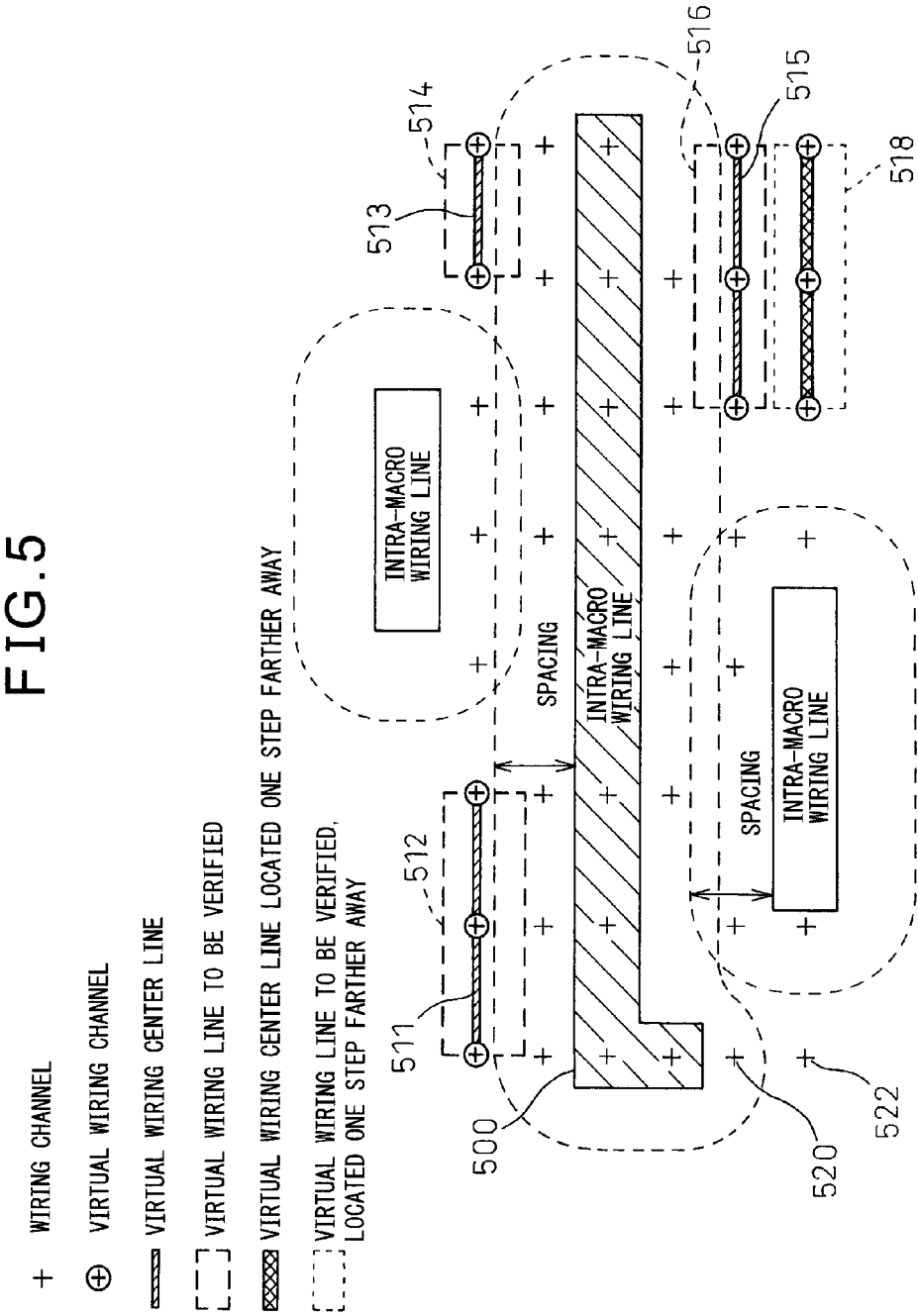
FIG. 5 is a diagram depicting an example of how the parallel wiring length is verified.

In the example of FIG. 5, virtual wiring center lines 511, 513, and 515 are set for the intra-macro wiring line 500. Since channel 520 violates the spacing rules, no virtual wiring center line is set between the channels 520 and 522. In step 404, all the virtual wiring center lines (each defined by the wiring layer and the channels) that can be set for each intra-macro wiring line are acquired.

Next, from among the thus set virtual wiring center lines, one virtual wiring center line for assuming the virtual wiring line to be verified is extracted (step 406). Then, the wiring line width information is retrieved that is used for the wiring layer in which the extracted virtual wiring center line is placed (step 408). If there is a plurality of such wiring line width information, a given one of the plurality of pieces of wiring line width information is retrieved. Next, the wiring line width retrieved in step 408 is applied to the virtual wiring center line extracted in step 406, and the resulting wiring line is assumed as the virtual wiring line to be verified (step 410).

In the example of FIG. 5, for the virtual wiring center lines 511, 513, and 515, the wiring lines 512, 514, and 516, each provided with a physical wiring line width, are assumed as the virtual wiring lines to be verified.

Next, the parallel wiring length is calculated that represents the length along which each virtual wiring line assumed in step 410 as the virtual wiring line to be verified runs in parallel with the intra-macro wiring line (step 412). Then, it is determined whether or not the calculated parallel wiring length exceeds a specified value (reference value) defined in the design rules (step 414).

If the calculated parallel wiring length exceeds the specified value, a report indicating the possibility of an error is output, and at the same time, the wiring layer, wiring line width, and channel information associated with that virtual wiring line is output as the information concerning the wiring line that can cause an error in the LSI circuit design layout, and the information is stored on the hard disk device 230 (FIG. 2) (step 416).

Further, if the parallel wiring length exceeds the specified value, it is determined whether there is a channel one step farther away from the intra-macro wiring line than the channel in which the virtual wiring line has been assumed (step 418); if there is such a channel, a virtual wiring line is set for that channel, and the process returns to step 412.

In the example of FIG. 5, if the virtual wiring line 516, for example, is found to cause an error, it is determined whether there is a channel one step farther away from the intra-macro wiring line than the channels where the virtual wiring line 516 is placed. Since there are channels one step farther away, a virtual wiring line 518 interconnecting such channels is assumed, and it is verified whether or not the virtual wiring line 518 causes an error. If the virtual wiring line 518 causes an error, it is determined whether there is a channel located still farther away, and the process for verifying the virtual wiring line interconnecting such channels is repeated. Then, the conditions under which the virtual wiring line causes an error are stored. The virtual wiring line verification is repeated until there is no longer any error.

When the verification is completed for a given wiring line width, it is determined whether the verification is completed for all the wiring line widths (step 422); if there is any wiring line width yet to be verified, the process returns to step 408 to retrieve the wiring line width information. Then, the virtual wiring line verification is performed based on the retrieved wiring line width.

When the verification is completed for all the wiring line widths for a given virtual wiring center line, it is determined whether the verification is completed for all the virtual wiring center lines (step 424). If there is any virtual wiring center line yet to be verified, the process returns to step 406 to extract the virtual wiring center line information. Then, the virtual wiring line verification is performed for the extracted virtual wiring line. When the verification is completed for all the virtual wiring center lines, the routine is terminated.

Figure 6:
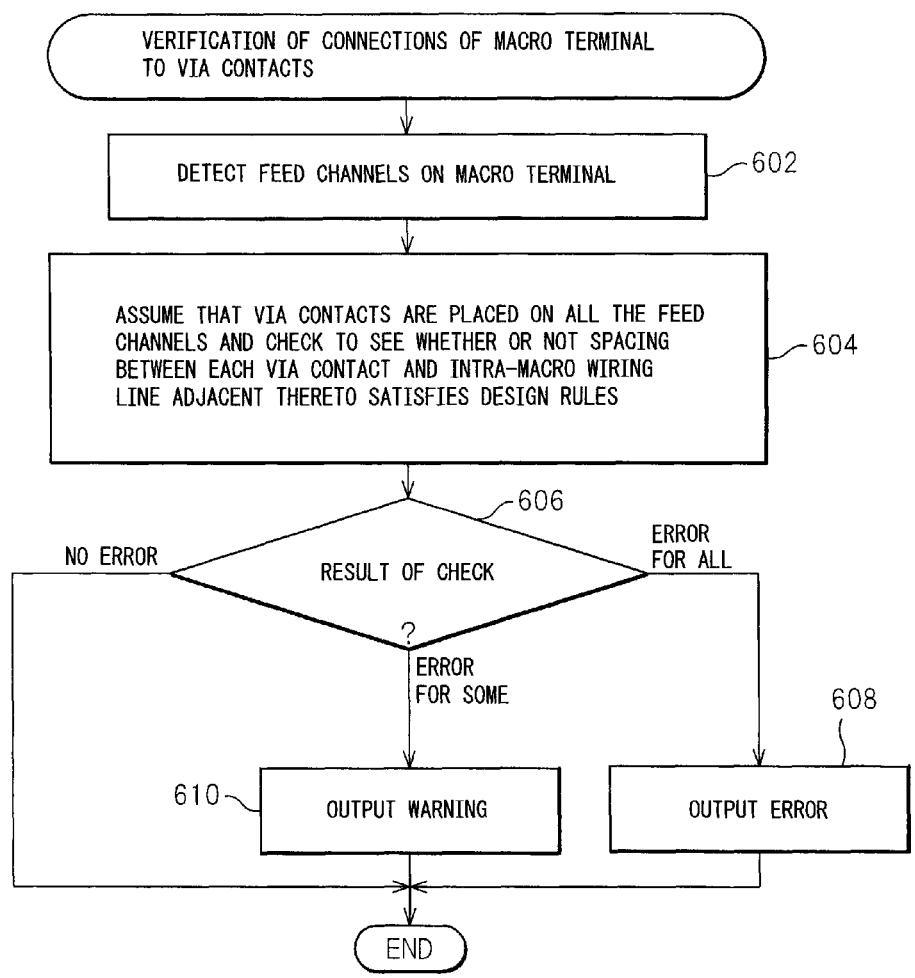
FIG. 6 is a flowchart illustrating a procedure for verifying connections of a macro terminal to via contacts.
Figure 7:
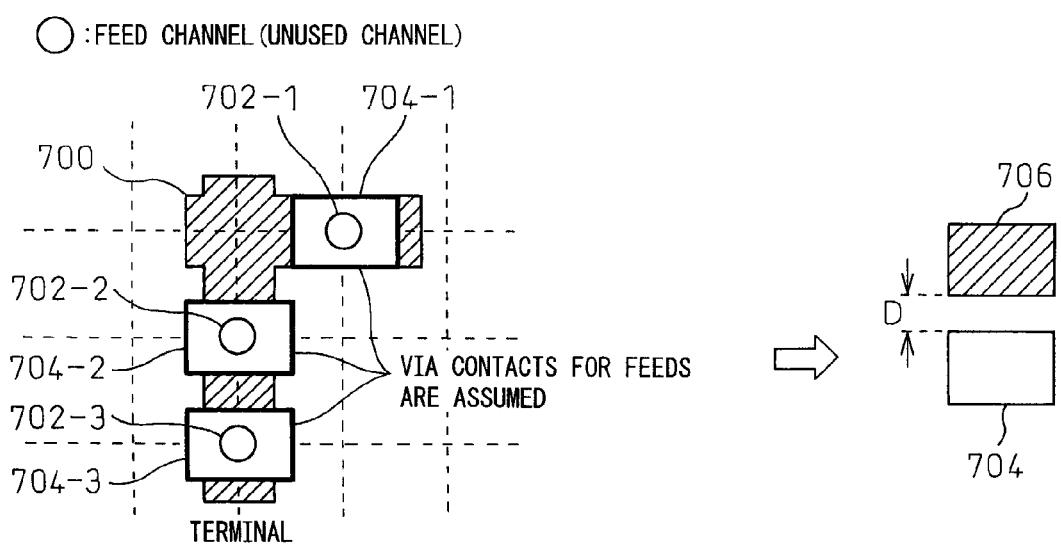
FIG. 7 is a diagram depicting an example of how the connections of the macro terminal to via contacts are verified.

In the present embodiment, the second item of the macro layout verification concerns verifying the connections of a macro terminal to via contacts. This verification is performed to verify whether or not the relationship between each via contact and the layout within the macro satisfies the layout rules when the via contact is placed on the macro terminal for the inter-macro wiring on the LSI circuit. FIG. 6 is a flowchart illustrating a procedure for verifying the connections of a macro terminal to via contacts, and FIG. 7 is a diagram depicting an example of how the connections of the macro terminal to via contacts are verified.

First, unused channels on the macro terminal are detected as feed channels (step 602). In the example of FIG. 7, it is assumed that feed channels 702-1, 702-2, and 702-3, for example, are detected on the macro terminal 700.

Next, assuming that via contacts are placed on all the feed channels, it is checked to see whether or not the spacing between each via contact and the intra-macro wiring line adjacent to it satisfies the design rules (step 604). In the example of FIG. 7, via contacts 704-1, 704-2, and 704-3 are assumed. Then, for each assumed via contact 704, the spacing D from the intra-macro wiring line 706 adjacent to it is checked.

Next, the result of the check in step 604 is evaluated (step 606). If it is determined that, for all of the assumed via contacts, the spacing D from the adjacent intra-macro wiring line is smaller than a reference value and thus violates the design rules, an error message to that effect is output and the information is stored on the hard disk device 230 (FIG. 2) (step 608).

On the other hand, if it is determined that, for some of the assumed via contacts, the spacing from the adjacent intra-macro wiring line violates the rules, in other words, there are feed channels that do not cause an error, a warning message is output to the effect that an error can occur in the LSI circuit design layout, and the information is stored on the hard disk device 230 (step 610).

If, for all of the assumed via contacts, the spacing from the adjacent intra-macro wiring line satisfies the design rules, i.e., if there is no error, the process is terminated without issuing any message.

In the present embodiment, the third item of the macro layout verification concerns verifying the feed channels of the macro terminal. This verification is performed to verify whether or not the macro contains an unused channel that can be brought out in a continuous fashion from the macro terminal to a designated wiring layer for the inter-macro wiring on the LSI circuit. The designated wiring layer here refers to the wiring layer where the destination macro terminal, to which signals from the macro terminal under verification are to be fed, is placed.

Figure 9A:
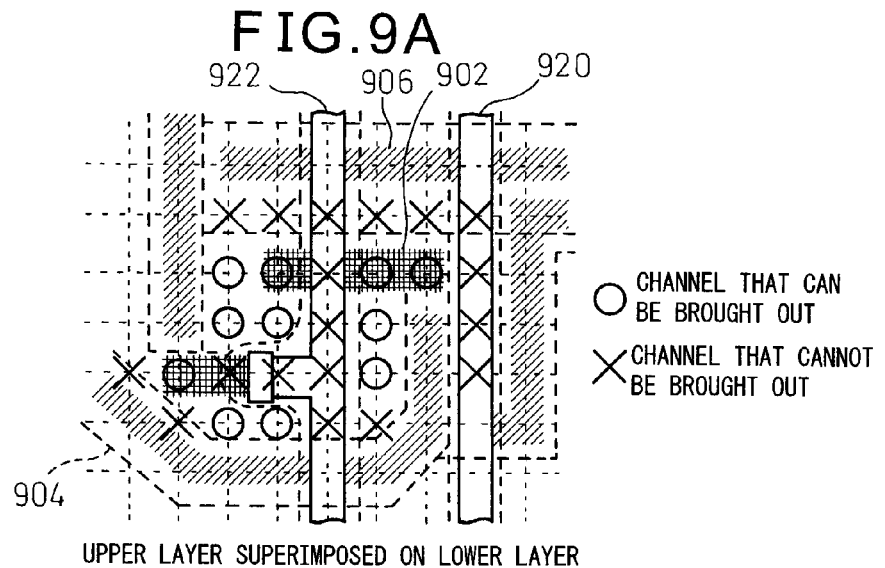
FIGS. 9A, 9B, and 9C are diagrams depicting an example of how the feed channels of the macro terminal are verified.
Figure 9B:
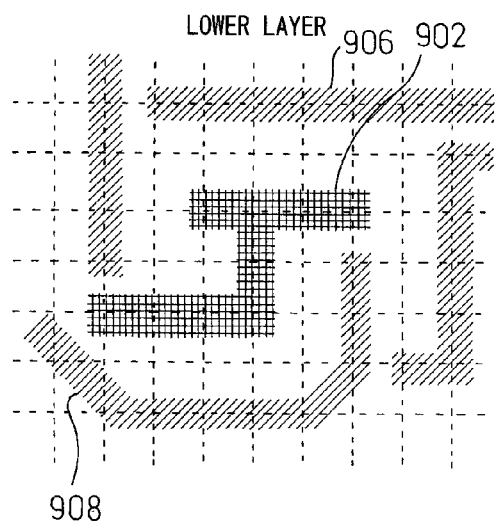
Figure 9C:
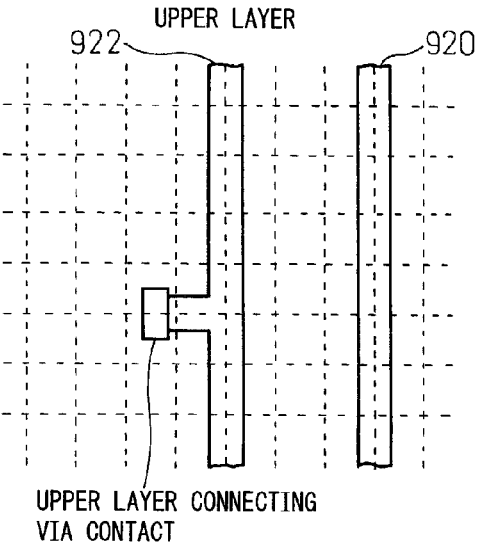

FIG. 8 is a flowchart illustrating a procedure for verifying the feed channels of the macro terminal, and FIGS. 9A, 9B, and 9C are diagrams depicting an example of how the feed channels of the macro terminal are verified. Specifically, the example of FIG. 9 depicts the case where the designated wiring layer is located one layer above the wiring layer in which the macro terminal under verification is placed. For convenience, the wiring layer in which the macro terminal is placed is referred to as the lower layer, and the designated wiring layer as the upper layer; then, FIG. 9A is a diagram depicting the wiring on the upper layer in a superimposed fashion on the wiring on the lower layer, FIG. 9B is a diagram depicting the wiring on the lower layer, and FIG. 9C is a diagram depicting the wiring on the upper layer.

First, the wiring layer containing the macro terminal is set as the target wiring layer, and channels covered by the macro terminal are detected (step 802). Next, unused channels located in the vicinity of the detected channels are detected (step 804).

Figure 10A:
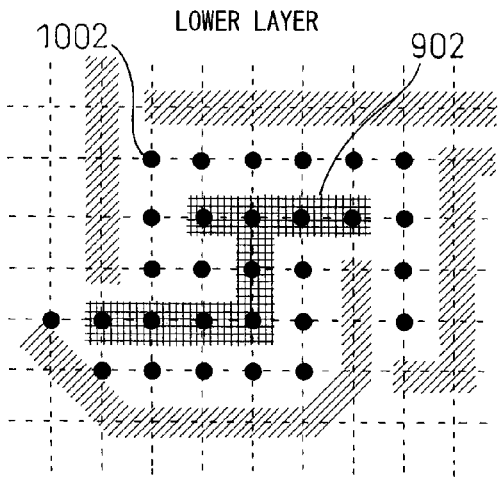
FIGS. 10A, 10B, and 10O are diagrams for explaining how the feed channels of the macro terminal are checked.

In the example of FIG. 9, the virtual wiring line 902 functions as the macro terminal. In FIG. 9A, a dashed line 904 and other dashed lines indicate the spacing provided around the wiring line. By carrying out the steps 802 and 804, a total of 29 channels indicted by black dots in FIG. 10A are detected for the macro terminal 902 depicted in FIG. 9.

Next, those channels that are located in the spacing belonging to other metal wiring lines are removed from the detected channels (step 806).

Figure 10B:
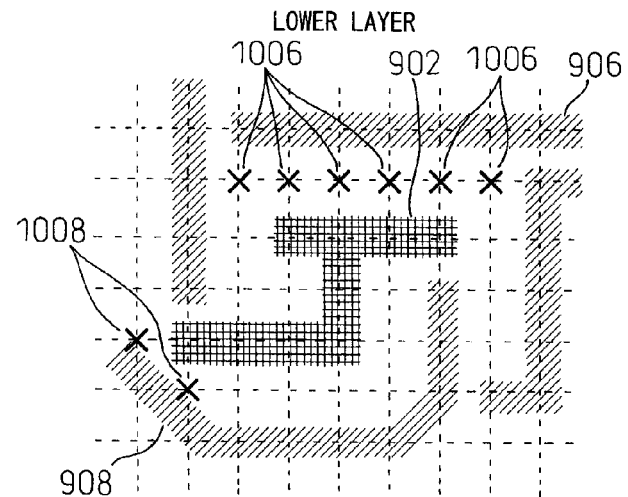

In the example of FIG. 9, six channels 1006 depicted in FIG. 10B are removed as they are located in the spacing belonging to the metal wiring line 906, and two channels 1008 depicted in FIG. 10B are removed as they are located in the spacing belonging to the metal wiring line 908. As a result, the number of detected channels is given as 29−6−2=21.

Next, those channels that cannot be brought out to the adjacent wiring layer on the designated wiring layer side are removed from the detected channels (step 808). The channels that cannot be brought out to the adjacent wiring layer each refer to a channel that becomes connected to a metal wiring line on the adjacent wiring layer or runs into the spacing belonging to it when a connection is made from that channel to the adjacent wiring layer through a via contact.

Figure 10C:
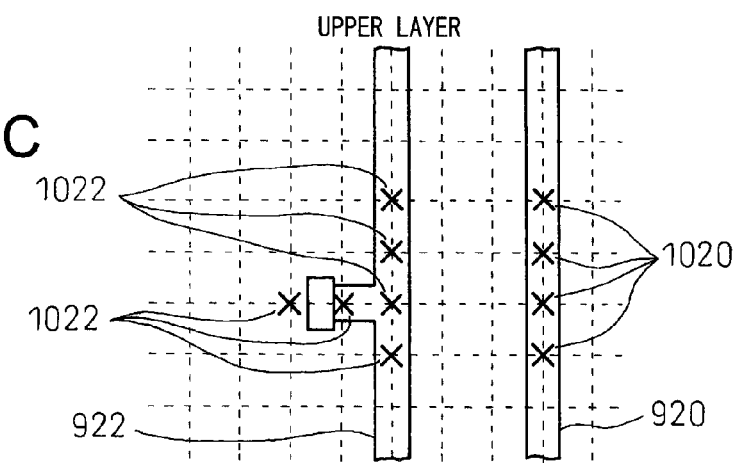

In the example of FIG. 9, four channels 1020 depicted in FIG. 10C are removed as they become connected to the metal wiring line 920 on the upper layer, and six channels 1022 depicted in FIG. 10C are removed as they become connected to the metal wiring line 922 on the upper layer or run into the spacing belonging to it. As a result, the number of detected channels is given as 21−4−6=11.

Next, it is determined whether the adjacent wiring layer is the designated wiring layer itself (step 810). If it is not, the target wiring layer is shifted to the adjacent wiring layer (step 812), and the process returns to step 804, to repeat the above process based on the number of currently detected channels. On the other hand, if it is the designated wiring layer, the process proceeds to step 814.

In the example of FIG. 9, since the adjacent wiring layer is the designated wiring layer itself, the process proceeds to step 814.

In step 814, the number of currently detected channels is taken to represent the number N of channels that can be brought out to the designated wiring layer in a continuous fashion, and the value of N is evaluated. If the value of N is "0", since signals cannot be fed from the macro terminal to the designated wiring layer within the macro, an error message to that effect is output and the information is stored on the hard disk device 230 (step 816). If the value of N is not "0" but is smaller than a reference value R (for example, "10"), it is determined that signals may not be able to be fed to the designated wiring layer, so that an error message to that effect is output and the information is stored on the hard disk device 230 (step 818). If the value of N is not smaller than the reference value R, the process is terminated without issuing any message.

In the example of FIG. 9, since the value of N is "11", and the reference value R is set to "10", the process is terminated without issuing any message. Finally, in the example of FIG. 9, it is determined for the macro terminal 902 that the channels indicated by x are the channels that cannot be brought out and that the channels indicated by ○ (11 channels) are the channels that can be brought out.

According to the macro layout verification apparatus disclosed herein, since parallel wiring errors that can occur due to interference between the intra-macro wiring and the wiring (inter-macro wiring) to be made at the time of LSI layout design are detected in advance at the time of the macro layout verification, any error to be output at the time of the LSI layout verification can be predicted and avoided in advance, which serves to reduce the number of process steps required for the LSI layout design.

Furthermore, according to the macro layout verification apparatus disclosed herein, an error that can occur when connecting the macro terminal in the LSI design layout or the possibility of the occurrence of such an error can be detected in advance when designing the macro layout.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. A macro layout verification apparatus, comprising:
    a unit configured to assume that a plurality of via contacts are respectively placed at different places on a terminal of a macro that is a functional block of circuits on a semiconductor device;
    a unit configured to determine whether or not the relationship between each of the via contacts and a wiring line within the macro satisfies a design rule; and
    a unit configured to store a warning message when one of the via contacts satisfies the design rule and another one of the via contact does not satisfy the design rule.

2. The macro layout verification apparatus according to claim 1, wherein the different places on the terminal are all unused channels.

* * * * *